(12) United States Patent
Chew

(10) Patent No.: US 11,881,415 B2
(45) Date of Patent: Jan. 23, 2024

(54) METHOD OF PACKAGING CHIP AND CHIP PACKAGE STRUCTURE

(71) Applicant: PEP INNOVATION PTE. LTD., Singapore (SG)

(72) Inventor: Hwee Seng Jimmy Chew, Singapore (SG)

(73) Assignee: PEP INNOVATION PTE LTD, Singapore (SG)

(*) Notice: Subject to any disclaimer, the term of this patent is extended or adjusted under 35 U.S.C. 154(b) by 187 days.

(21) Appl. No.: 17/346,310

(22) Filed: Jun. 14, 2021

(65) Prior Publication Data

US 2021/0305064 A1 Sep. 30, 2021

Related U.S. Application Data

(62) Division of application No. 15/826,268, filed on Nov. 29, 2017, now Pat. No. 11,049,734.

(30) Foreign Application Priority Data

Nov. 29, 2016 (SG) .......................... 10201610033Y

(51) Int. Cl.
*H01L 21/56* (2006.01)
*H01L 23/31* (2006.01)
(Continued)

(52) U.S. Cl.
CPC .......... *H01L 21/568* (2013.01); *H01L 21/561* (2013.01); *H01L 21/78* (2013.01);
(Continued)

(58) Field of Classification Search
CPC ..... H01L 21/568; H01L 21/561; H01L 21/78; H01L 23/3114; H01L 23/3135; H01L 23/367; H01L 23/49838; H01L 23/528; H01L 25/0657; H01L 2224/96; H01L 21/56; H01L 23/31
See application file for complete search history.

(56) References Cited

U.S. PATENT DOCUMENTS 7,830,004 B2 * 11/2010 Wu ..................... H01L 24/82
257/E23.005
2013/0075928 A1 * 3/2013 Gallegos ........... H01L 21/76885
257/774

* cited by examiner

*Primary Examiner* — Thanhha S Pham
(74) *Attorney, Agent, or Firm* — Javalon Law, PC

(57) ABSTRACT

The present disclosure discloses a method of packaging a chip and a chip package structure. The method of packaging the chip includes: forming a protective layer on a front surface of a chip to be packaged; mounting the chip to be packaged formed with the protective layer on the front surface on a first carrier, the back surface of the chip to be packaged facing upwards and a front surface thereof facing towards the first carrier; forming a first encapsulation layer, the first encapsulation layer being formed on the back surface of the chip to be packaged and the exposed first carrier; and detaching the first carrier to exposed the protective layer. In the present disclosure, when the chip to be packaged is mounted on the carrier after the protective layer is formed on the front surface thereof, and then the first encapsulation layer is formed on the chip to be packaged, the encapsulation material can be prevented from permeating to the gap between the chip to be packaged and the carrier and thereby damaging the circuit structure and/or the bonding pad on the chip to be packaged.

9 Claims, 15 Drawing Sheets

(51) Int. Cl.
  *H01L 23/528*   (2006.01)
  *H01L 21/78*    (2006.01)
  *H01L 23/367*   (2006.01)
  *H01L 25/065*   (2023.01)
  *H01L 23/498*   (2006.01)
  *H01L 23/00*    (2006.01)
  H01L 23/538     (2006.01)

(52) U.S. Cl.
  CPC ...... *H01L 23/3114* (2013.01); *H01L 23/3121* (2013.01); *H01L 23/3135* (2013.01); *H01L 23/367* (2013.01); *H01L 23/49838* (2013.01); *H01L 23/528* (2013.01); *H01L 24/19* (2013.01); *H01L 24/96* (2013.01); *H01L 25/0657* (2013.01); H01L 23/5389 (2013.01); H01L 2223/5448 (2013.01); H01L 2224/04105 (2013.01); H01L 2224/12105 (2013.01); H01L 2224/32225 (2013.01); H01L 2224/92144 (2013.01); H01L 2224/97 (2013.01); H01L 2924/19105 (2013.01)

METHOD OF PACKAGING CHIP AND CHIP PACKAGE STRUCTURE

CROSS-REFERENCE TO RELATED APPLICATIONS

This application is a Divisional of co-pending U.S. patent application Ser. No. 15/826,268, field on Nov. 29, 2017. The disclosure of all of which is herein incorporated by reference in its entirety for all purposes.

TECHNICAL HELD

The present disclosure relates to the field of semiconductor technology, and in particular, to a method of packaging a chip and to a chip package structure.

BACKGROUND

In the prior art, a common chip packaging technology mainly includes the following processes. First, the front surface of the chip is adhered to the substrate wafer by an adhesive tape and plastic-packaged on wafer level, and the substrate wafer is detached. Then, a rewiring layer is formed by performing rewiring on the front surface of the chip, and the packaging is performed.

SUMMARY

According to the first aspect, the present disclosure provides a method of packaging a chip, comprising:
  providing a wafer prepared with a plurality of dies, the water includes front and back wafer surfaces, wherein the front wafer surface of the wafer is an active water surface with bond pads of the plurality of dies;
  forming a protective layer on the front wafer surface, the protective layer having first and second protective layer surfaces, wherein the second protective layer surface is disposed on the front wafer surface;
  forming via openings in the protective layer to expose the bond pads;
  dicing the wafer with the protective layer to separate the pluralities of dies into individual chips with front and back chip surfaces, wherein the front chip surface of the chips comprises the bond pads;
  mounting the plurality of chips with the protective layer on a chip carrier with an adhesive layer, wherein the first protective layer surface is disposed on the adhesive layer;
  encapsulating the plurality of chips with a high pressured encapsulant to form a mold panel, the mold panel includes first and second encapsulant surfaces of the high pressured encapsulant, wherein the first encapsulant surface is coplanar with the first protective layer surface;
  detaching the chip carrier with the adhesive layer from the mold panel with the plurality of chips;
  forming a rewiring structure on the first protective layer surface of the protective layer, wherein the rewiring structure includes conductive lines electrically coupled to the bond pads of the plurality of chips; and
  singulating the plurality of chips of the mold panel with the high pressured encapsulant and the rewiring structure to form a plurality of chip packages.

According to the second aspect of the present disclosure, there is provided another method of packaging a chip, comprising:
  providing a wafer prepared with a plurality of dies, the wafer includes front and back wafer surfaces, wherein the front wafer surface of the wafer is an active water surface with bond pads of the plurality of dies;
  forming a protective layer on the front wafer surface, the protective layer having first and second protective layer surfaces, wherein the second protective layer surface is disposed on the front wafer surface;
  dicing the wafer with the protective layer to separate the pluralities of dies into individual chips with front and back chip surfaces, wherein the front chip surface of the chips comprises the bond pads;
  mounting the plurality of chips with the protective layer on a chip carrier with an adhesive layer, wherein the first protective layer surface is disposed on the adhesive layer;
  encapsulating the plurality of chips with a high pressured encapsulant to form a mold panel, the mold panel includes first and second encapsulant surfaces of the high pressured encapsulant, wherein the first encapsulant surface is coplanar with the first protective layer surface;
  detaching the chip carrier with the adhesive layer from the mold panel with the plurality of chips;
  forming via openings in the protective layer to expose the bond pads;
  forming a rewiring structure on the first protective layer surface of the protective layer, wherein the rewiring structure includes conductive lines electrically coupled to the bond pads of the plurality of chips; and
  singulating the plurality of chips of the mold panel with the high pressured encapsulant and the rewiring structure to form a plurality of chip packages.

DETAILED DESCRIPTION

Figure 1:
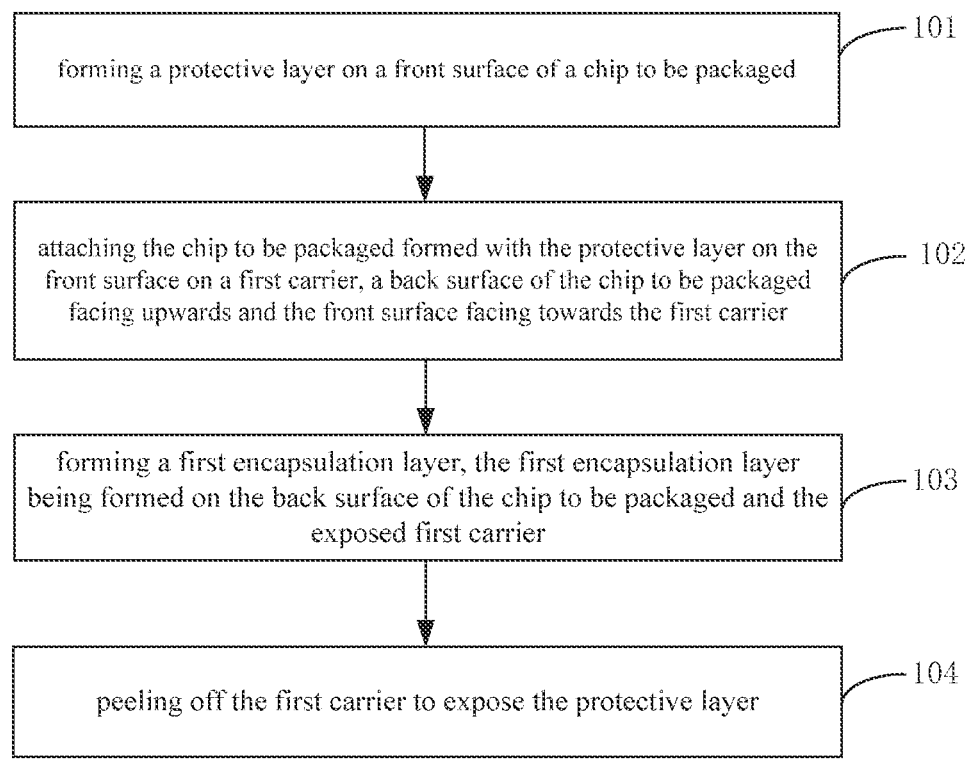
FIG. 1 is a flowchart of a method of packaging a chip according to an exemplary embodiment of the present disclosure.

To make the Objectives, technical solutions, and advantages of the present disclosure more comprehensible, the present disclosure is further described in detail below with reference to the specific embodiments and the accompanying drawings.

However, those skilled in the art will readily appreciate that the detailed description given herein with respect to these drawings is for explanatory purposes as the disclosure extends beyond these limited embodiments. For example, it should be appreciated that those skilled in the art will, in light of the teachings of the present disclosure, recognize a multiplicity of alternate and suitable approaches, depending upon the needs of the particular application, to implement the functionality of any given detail described herein, beyond the particular implementation choices in the following embodiments described and shown. That is, there are modifications and variations of the disclosure that are too numerous to be listed but that all fit within the scope of the disclosure. Also, singular words should be read as plural and vice versa and masculine as feminine and vice versa, where appropriate, and alternative embodiments do not necessarily imply that the two are mutually exclusive.

It is to be further understood that the present disclosure is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present disclosure. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

As used in this specification and claim(s), the words 'comprising' (and any form of comprising, such as 'comprise' and 'comprises'). 'having' (and any form of having, such as 'have' and 'has'), 'including' (and any form of including, such as 'includes' and 'include'), or 'containing' (and any form of containing, such as 'contains' and 'contain') are inclusive or open-ended and do not exclude additional, unrecited elements or method steps.

During packaging, after the front surface of a chip to be packaged is mounted on a carrier, when the back surface of the chip to be packaged is encapsulated, it is usually necessary to form an encapsulation layer by high-pressure forming. In this process, the encapsulation material easily permeates into the gap between the chip to be packaged and the carrier, and thus may damage the bonding pad and/or circuit on the front surface of the chip to be packaged, resulting in an increase in the chip defect rate.

According to various embodiments of the present disclosure, there is provided a method of packaging a chip. During packaging, a protective layer is formed on the front surface of the chip to be packaged, and the chip to be packaged formed with the protective layer on the front surface is mounted on a first carrier, the front surface of the chip to be packaged faces towards the first carrier, the back surface faces upwards, i.e., faces outwards with respect to the carrier. Then, a first encapsulation layer is formed to cover the chip to be packaged and the first carrier. After the encapsulation is completed, the first carrier is detached, that is, the first carrier is removed to expose the protective layer and the first encapsulation layer. According to the above embodiments of the present disclosure, when the chip to be packaged is mounted on the carrier after the protective layer is formed on the front surface thereof, and then the first encapsulation layer is formed on the chip to be packaged, the encapsulation material can be prevented from permeating to the gap between the chip to be packaged and the carrier and thereby damaging the circuit structure and/or the bonding pad on the chip to be packaged.

FIG. 1 is a flowchart of a method of packaging a chip according to an exemplary embodiment of the present disclosure. As shown in FIG. 1, the method of packaging the chip includes the following steps 101 to 104. Wherein, in step 101, a protective layer is formed on the front surface of a chip to be packaged.

In an embodiment, the chip to be packaged is formed by thinning and cutting a semiconductor wafer. Each semiconductor wafer can form a plurality of chips to be packaged, and there are cutting lines between the chips to be packaged. Each semiconductor wafer is thinned and cut to form a plurality of chips The front surface of the chip to be packaged is configured by conductive electrodes that are led out from an internal circuit of the chip to the surface of the chip. Pads are prepared on these conductive electrodes.

In the present embodiment, a protective layer is formed on the front surface of the chip to be packaged prior to the chip to be packaged is mounted on the first carrier. The protective layer may be formed on the front surface of the semiconductor wafer before the semiconductor wafer is cut into a plurality of chips to be packaged, and then the semiconductor wafer is cut to obtain chips to be packaged formed with the protective layer on the front surfaces. Of course, it can be understood that, if the process allows, after the semiconductor wafer is cut in to the chips to be packaged, a protective layer may be formed on the front surface of each chip to be packaged. The specific selection depends on the actual situation.

Figure 2:
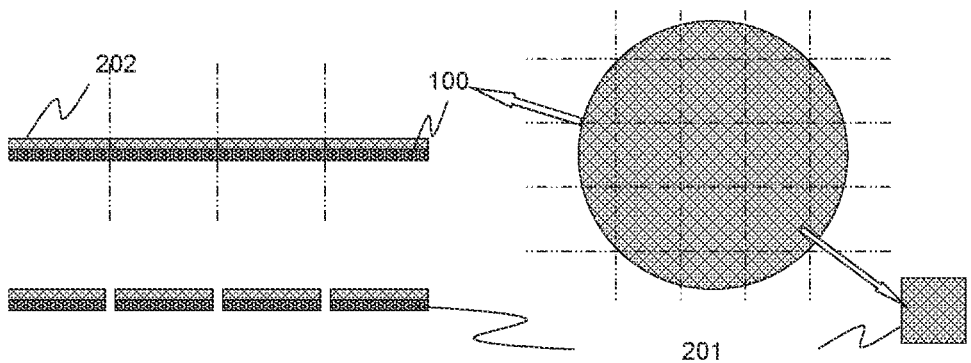
FIGS. 2 (a) to (o) are a flowchart of a method of packaging a chip according to an exemplary embodiment of the present disclosure.
Figure 2:
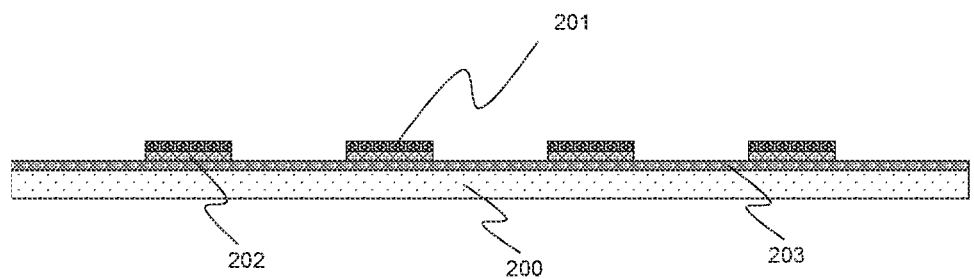
Figure 2:
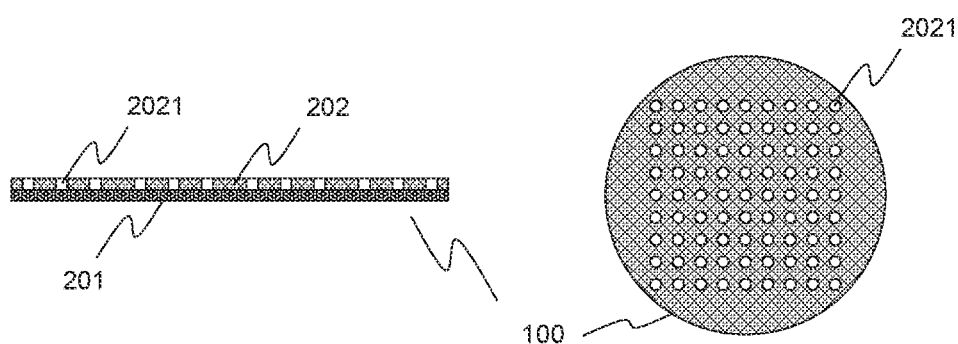
Figure 2:
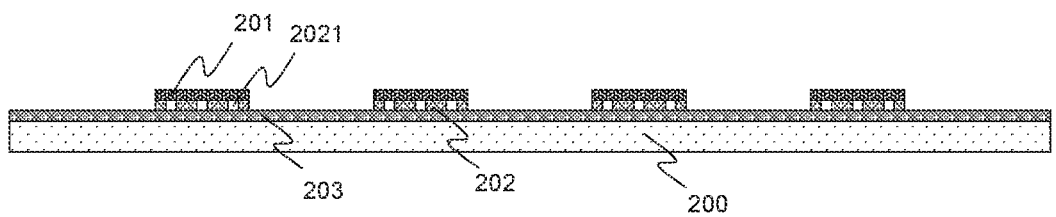
Figure 2:
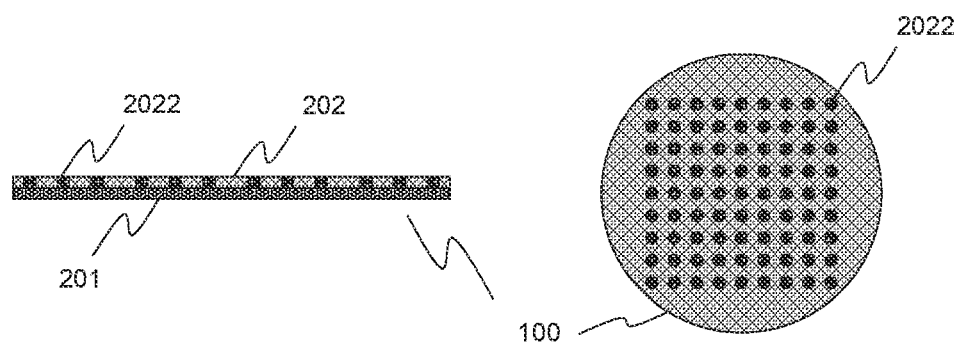
Figure 2:
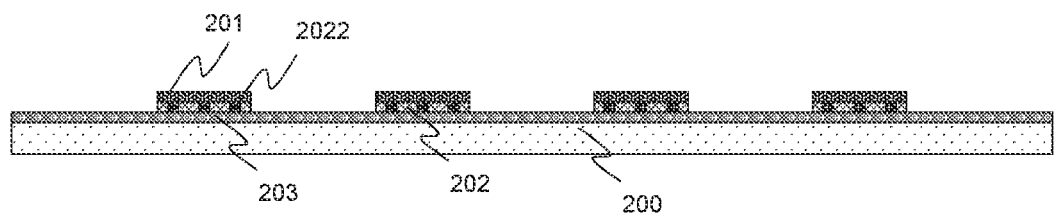
Figure 2:
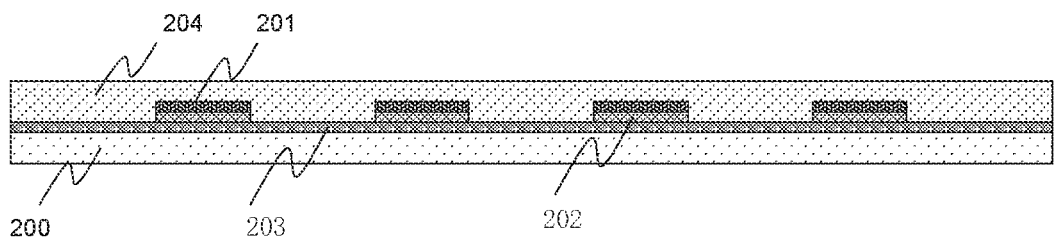
Figure 2:
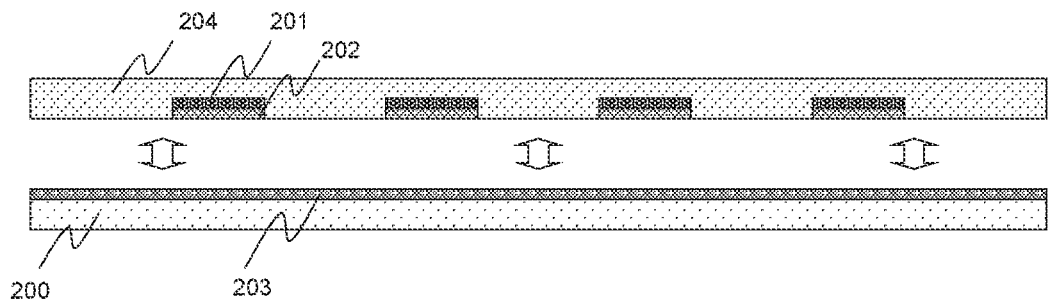
Figure 2:
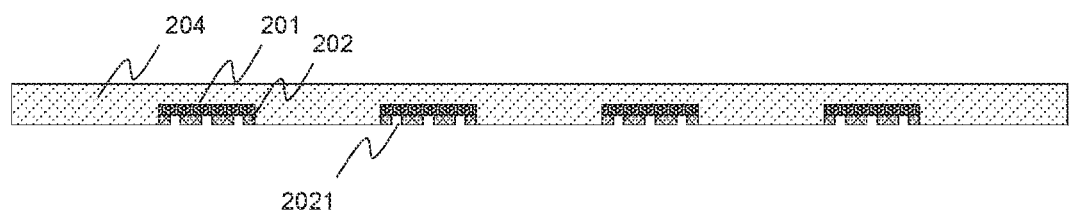
Figure 2:
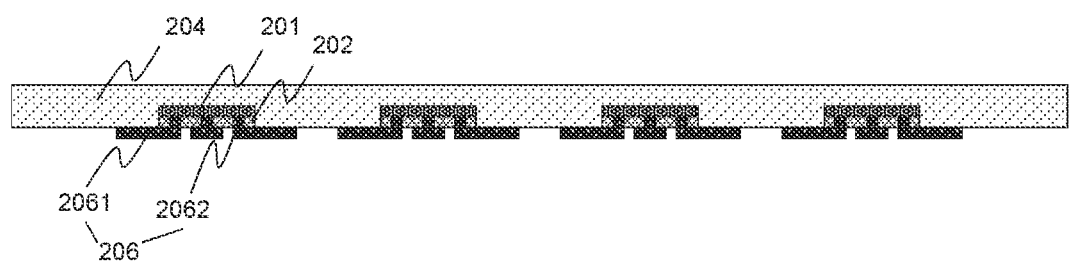
Figure 2:
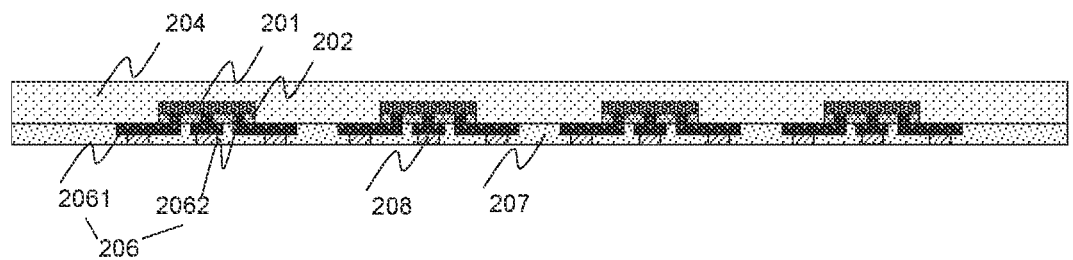
Figure 2:
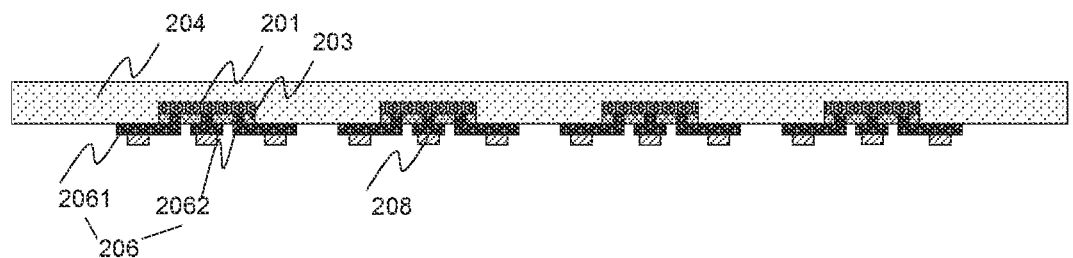
Figure 2:
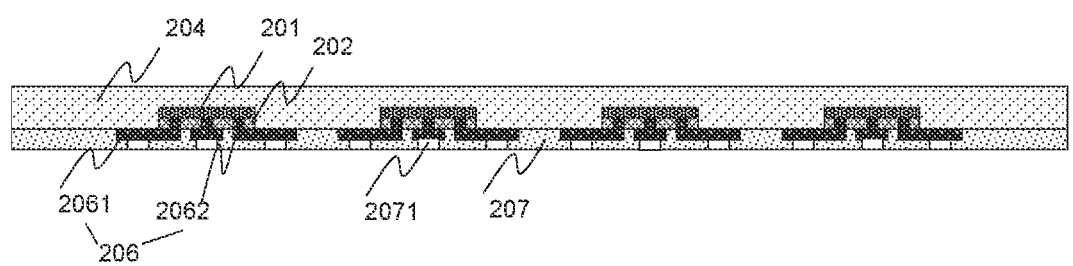
Figure 2:
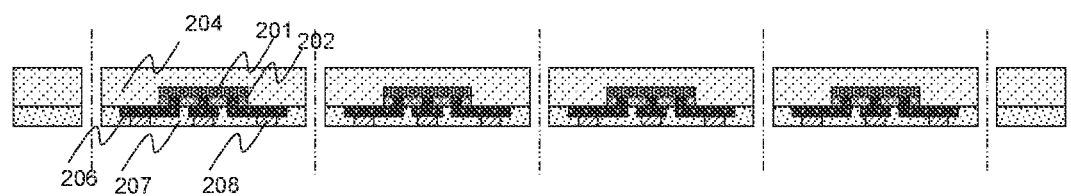
Figure 2:
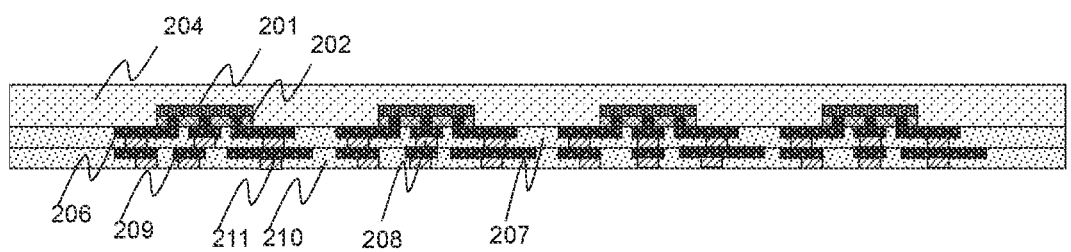

FIG. 2 shows the process flowchart of a method of packaging a chip in an exemplary embodiment of the present disclosure.

As shown in FIG. 2 (a), a protective layer 202 is formed on the front surface of the semiconductor wafer 100, i.e., the surface corresponding to the front surface of the chip 201 to be packaged, and then the semiconductor wafer 100 formed with the protective layer 202 is cut along the cutting lines to obtain a plurality of chips 201 to be packaged formed with fire protective layer.

The protective layer 202 may be made of an insulating material, such as polyimide, epoxy resin, ABF (Ajinomoto buildup film), PBO (Polybenzoxazole) and the like. Optionally, the material of the protective layer is selected to be a material being insulating and adaptable to chemical cleaning, grinding and the like. The protective layer may be formed on the semiconductor wafer by lamination, coating, printing or the like. Since a semiconductor wafer 100 are typically thinned, for example, thinned to about 50 micrometers prior to being cut, when the semiconductor wafer 100 is operated, by forming a protective layer 202 on the front surface of the semiconductor wafer 100, not only the circuit on the front surface of the semiconductor wafer 100 can be protected, but also the ultra-thin semiconductor wafer 100 can be supported to some extent.

In step 102, the chip to be packaged formed with the protective layer on the front surface is mounted on a first carrier, the back surface of the chip to be packaged faces upwards and a front surface thereof faces towards the first carrier.

As shown in FIG. 2 (b), a chip 201 to be packaged formed with a protective layer 202 on the front surface (a plurality of chips to be packaged are shown in the figure) is mounted on the first carrier 200. The chip 201 to be packaged formed with the protective layer 202 on the front surface is connected to the first carrier 200 by an adhesive layer 203, and the protective layer 202 is in direct contact with the adhesive layer 203.

In an embodiment, the shape of the carrier 200 may include a circular shape, a rectangular shape or other shapes. The present disclosure does not limit the shape of the carrier 200. The carrier 200 may be a small-sized wafer substrate, or may be a larger-sized carrier such as a stainless steel plate, a polymer substrate, or the like. With the method of packaging the chip according to the embodiment of the present disclosure, a carrier which is adaptable could have a size up to 600*600 mm.

In an embodiment, the chip 201 to be packaged may be mounted on the carrier 200 by an adhesive layer 203. An easily peelable material may be used for the adhesive layer 203 so as to detach the carrier 200 from the chip 201 to be packaged which has been packaged on the back surface thereof. For example, a thermal separation material capable of losing its viscosity by heating may be used. In other embodiments, the adhesive layer 203 may adopt a two-layer structure including a layer of thermal separation material and a chip attachment layer. The layer of thermal separation material is adhered to the carrier 200 and will lose its viscosity when heated, and can be detached from the carrier 200. The chip attachment layer adopts a layer of adhesive material, and can be used for adhering the chip 201 to be packaged. After the chip 201 to be packaged is detached from the carrier 200, the chip attachment layer thereon may be removed by chemical cleaning. In an embodiment, the adhesive layer 203 may be formed on the carrier 200 by lamination, printing, or the like.

Figure 3:
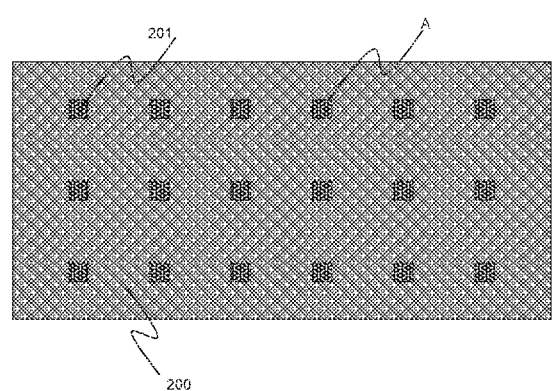
FIG. 3 is a schematic structural diagram of the front surface of a carrier according to an exemplary embodiment of the present disclosure.

In an embodiment, as shown in FIG. 3, an adhering position of the chip 201 to be packaged is provided in advance on the carrier 200. After the adhesive layer 203 is formed, the chip 201 to be packaged formed with the protective layer 202 on the front surface is adhered on the carrier 200 at a predetermined position A. In an embodiment, prior to the formation of the adhesive layer 203, the adhering position of the chip to be packaged may be marked on the carrier 200 by laser, mechanical engraving, photolithography or the like. At the same time, an alignment mark is also provided on the chip 201 to be packaged so as to be aligned with the adhering position on the carrier 200 at the time of adhering. It should be noted that the protective layer may be transparent under a certain kind of light so that the alignment mark provided on the chip 201 to be packaged can be seen and the chip 201 to be packaged can be adhered at the predetermined position A accurately. Further, in addition to adhering the chip 201 to be packaged on the carrier, if the package body needs a passive component, the passive component may be adhered around the chip 201 to be packaged. It can be understood that, in one packaging process, there may be a plurality of chips 201 to be packaged, that is, a plurality of chips 201 to be packaged are simultaneously mounted on the carrier 200 for packaging, and then cut into a plurality of packages after the packaging is completed. One package body may include one or more chips, and the positions of the plurality of chips may be freely set according to the actual product requirements.

In another embodiment, prior to cutting the wafer formed with the protective layer into a plurality of the chips to be packaged, the method further includes: forming protective layer openings in the protective layer at positions corresponding to bonding pads of a plurality of the chips to be packaged. As shown in FIG. 2 (c), before the semiconductor wafer 100 formed with the protective layer 202 is cut into a plurality of chips to be packaged, a plurality of protective layer openings 2021 are formed in the protective layer 202 at positions corresponding to the bonding pads of the plurality of chips 201 to be packaged, so that the bonding pads on the front surfaces of the chips 201 to be packaged or wirings led out from the bonding pads are exposed from the protective layer openings 2021. If the material of the protective layer is a laser reactive material, the hole-opening can be performed in a manner of forming one protective layer opening 2021 at one time by laser patterning. If the material of the protective layer is a photosensitive material, the hole-opening can be performed in a manner of forming a plurality of protective layer openings 2021 at one time by photolithographic patterning. The shape of the protective layer opening 2021 may be a circular shape, of course may be other shapes such as an elliptical shape, a square shape, a linear shape or the like. In an optional embodiment, as shown in FIG. 2 (d), a plurality of protective layer openings 2021 are formed in the protective layer 202, and the bonding pads on the chips are exposed from the protective layer openings 2021. After the chip formed with the protective layer 202 is adhered on the adhesive layer 203 of the carrier 200, the plurality of protective layer openings 2021 are in a hollow state.

In another embodiment, after forming the first openings in the protective layer at the positions corresponding to the bonding pads of a plurality of the chips to be packaged, the method further includes: filling a conductive medium in the protective layer openings so that the conductive medium is electrically connected to the bonding pads of the chips to be packaged. The conductive medium forms a vertical connection structure in the protective layer opening, so that the bonding pad on the surface of the chip extends only on one side to the surface of the protective layer, and the protective layer may be formed around the connection structure. As shown in FIG. 2 (e), a conductive medium 2022 is filled in the protective layer opening 2021 to lead out the bonding pad on the front surface circuit of the chip 203 to be packaged to the surface of the protective layer 202 for rewiring in a subsequent process. In an optional implementation manner, as shown in FIG. 2 (0, a plurality of protective layer openings 2021 are formed in the protective layer 202 and the protective layer openings 2021 are filled with a conductive medium. The conductive medium forms a vertical connection structure 2022 in the protective layer opening and leads out the bonding pad on the chip to the surface of the protective layer 202 in the vertical direction. The protective layer 202 and the connection structure 2022 are adhered on the adhesive layer 203 of the carrier 200.

In this embodiment of the present disclosure, by forming the protective layer opening 2021 and/or filling the conductive medium in the protective layer 202 in advance, the position of the bonding pad on the front surface of the chip can be accurately positioned through the protective layer opening 2021 and the area of the protective layer opening can be made smaller, the spacing between the openings can also be smaller. In this way, the wiring can be more closely in the subsequent rewiring, and there is no need to worry about the positioning deviation of the position of the bonding pad on the chip.

In step 103, a first encapsulation layer is formed, and the first encapsulation layer is formed on the chip to be packaged and the exposed first carrier.

The first encapsulation layer 204 is formed on the back surface of the chip 201 to be packaged and the exposed first carrier 200. When an adhesive layer 203 is formed on the exposed first carrier 200, the first encapsulation layer 204 is formed on the back surface of the chip 201 to be packaged and the exposed adhesive layer 203, as shown in FIG. 2 (g). The first encapsulation layer 204 is used to completely encapsulate the first carrier 200 and the chip 201 to be packaged to reconstruct a flat plate structure, so that after the carrier 200 is detached, rewiring and packaging can be continued on the reconstructed flat plate structure.

Optionally, prior to forming the first encapsulation layer 204, some pretreatment steps, such as chemical cleaning and plasma cleaning, may be performed to remove impurities on the surface, so that the first encapsulation layer can be more closely connected to the chip to be packaged and the first carrier without cracking.

In an embodiment, the first encapsulation layer 204 may be formed by laminating an epoxy resin film or ABF (Ajinomoto buildup film), or may be formed by performing injection molding, compression molding or transfer molding with respect to an epoxy resin compound). The first encapsulation layer 204 includes a first surface 2041 opposite to the first carrier 200 and is substantially flat and parallel to the surface of the first carrier 200. The thickness of the first encapsulation layer 204 may be thinned by grinding or polishing the first surface 2041. In an embodiment, the thickness of the first encapsulation layer 204 may be thinned to the back surface of the chip 201 to be packaged.

When performing the encapsulation by using the first encapsulation layer 204, since high-pressure forming is required in forming the first encapsulation layer, the encapsulation material easily permeates between the first carrier 200 and the chip 201 to be packaged during this process. According to this embodiment of the present disclosure, a protective layer 202 is formed on the front surface of the chip 201 to be packaged, and the connection between the protective layer 202 and the adhesive layer 203 is much tight, therefore the encapsulation material can be prevented from permeating therebetween. And even if there is a permeated encapsulation material, the surface of the protective layer 202 can be directly processed chemically or by grinding after detached from the carrier without directly contacting the front surface of the chip 201 to be packaged, and thus the circuit structure on the front surface of the chip 201 to be packaged cannot be damaged.

In step 104, the carrier is detached to expose the protective layer.

In an embodiment, as shown in FIG. 2 (h), the first carrier 200 may be directly mechanically detached. When the adhesive layer 203 between the first carrier 200 and the protective layer 202 is provided with a thermal separation material, the thermal separation material on the adhesive layer 203 may also be heated to reduce the viscosity, so as to detach the first carrier 200. After the first carrier 200 is detached, the lower surface of the first encapsulation layer 203 facing towards the first carrier 200 and the protective layer 202. After the first carrier 200 is detached, a flat plate structure including the chip 201 to be packaged, the protective layer 202 covering the front surface of the chip 201 to be packaged, and the first encapsulation layer 204 encapsulating the back surface of the chip 201 to be packaged is obtained. The formed flat plate structure may be rewired or the like according to the actual situation.

In the embodiment of the present disclosure, after the first carrier 200 is detached, the surfaces of the protective layer 202 and the first encapsulation layer 204 are exposed. In this case, the chip attachment layer in the adhesive layer 202 still exists on the surfaces of the protective layer 202 and the first encapsulation layer 204. When the chip attachment layer is removed chemically, the protective layer 202 can also protect the surface of the chip from damage, After the adhesive layer is completely removed, if the encapsulation material has permeated before, the surface can also be flattened by chemical cleaning or grinding to facilitate the subsequent wiring. Without the protective layer, the surface of the chip cannot be processed chemically or by grinding to avoid damaging the circuit on the front surface of the chip.

In an embodiment, after detaching the first carrier to expose the protective layer, the method further includes: forming a protective layer opening in the protective layer, the protective layer opening being located at a bonding pad of the chip to be packaged; and forming a first rewiring layer on the protective layer, the first rewiring layer being electrically connected to the bonding pad of the chip to be packaged through the protective layer opening.

As shown in FIG. 2 (i), after the first carrier 200 is detached, a plurality of protective layer openings 2021 are formed in the protective layer 202. Each protective layer opening 2021 is at least located corresponding to the bonding pad of the chip 201 to be packaged or the wiring led out from the bonding pad, so that the bonding pad on the front surface of the chip 201 to be packaged or the wiring led out from the bonding pad is exposed from the protective layer opening 2021. If the material of the protective layer is a laser reactive material, the hole-opening can be performed in a manner of forming one protective layer opening 2021 at one time by laser patterning. If the material of the protective layer is a photosensitive material, the hole-opening can be performed in a manner of forming a plurality of protective layer openings 2021 at one time by photolithographic patterning. The shape of the protective layer opening 2021 may be a circular shape, of course may be other shapes such as an elliptical shape, a square shape, a linear shape or the like.

As shown in FIG. 2 (j), after the protective layer opening 2021 is formed, rewiring is performed on the protective layer 202, that is, a first rewiring layer 206 is formed. In this embodiment, the front surface of the chip 201 to be packaged is provided with the bonding pads of the chip internal circuit, and these bonding pads can be led out by rewiring on the front surface of the chip 201 to be packaged.

In an embodiment, as shown in FIG. 2 (j), the first rewiring layer 206 is formed on the surface of the protective layer 202 and is made of electrically conductive material, for example, a metal such as copper and the like. The first rewiring layer 206 includes a connection portion 2061 filled in the protective layer opening 2021 and a patterned wiring 2062 formed on the surface of the protective layer 202. The connection portion 2061 is electrically connected to the bonding pad on the surface of the chip 201 to be packaged, and the patterned wiring 2062 is electrically connected to the connection portion 2061.

In another embodiment, if a protective layer opening 2021 has been formed on the protective layer 202 after detaching the first carrier to exposed the protective layer, the method further includes: forming a first rewiring layer 206 on the protective layer, wherein the electrically conductive material of the first rewiring layer 206 is filled into the protective layer opening 2021 so that the first rewiring layer is electrically connected to the bonding pad on the chip to be packaged through the protective layer opening.

Before the chip to be packaged formed with the protective layer 202 is attached on the first carrier 200, if the protective layer opening 2021 has been formed on the protective layer 202, and in the case where a conductive medium is filled in the protective layer opening 2021, the rewiring may be performed directly on the protective layer 202, that is, the first rewiring layer 205 is formed.

In the conventional process, since the front surface of the chip to be packaged is bare, it is necessary to form a passivation layer on the front surface of the chip to be packaged prior to forming the rewiring layer, and form the rewiring layer after opening a hole in the passivation layer. However, in the above manner of the present disclosure, by forming a protective layer 202 on the front surface of the chip 201 to be packaged, not only the chip 201 to be packaged can be protect from being damaged in the subsequent process, but also the step of manufacturing the passivation layer can be omitted, and the manufacturing cost is greatly saved.

Figure 4:
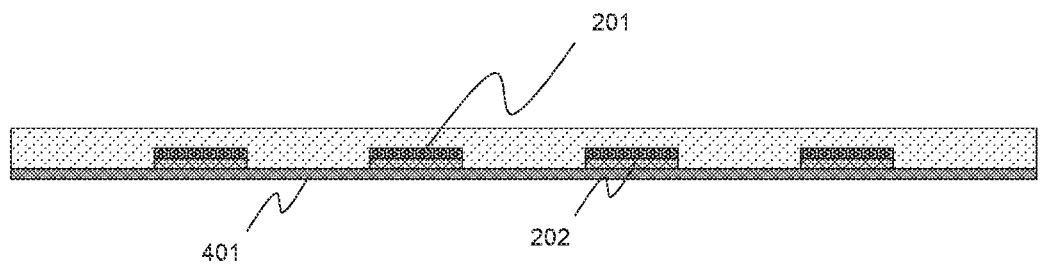
FIGS. 4 (a) to (g) are a flowchart of a method of packaging a chip according to another exemplary embodiment of the present disclosure.
Figure 4:
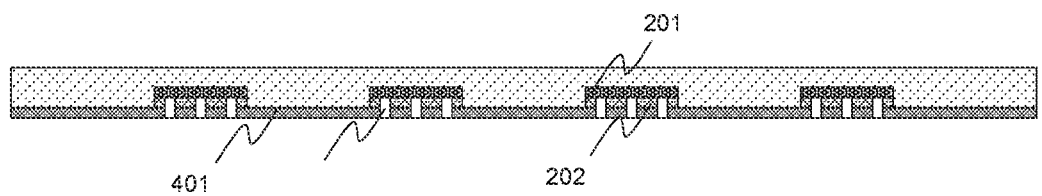
Figure 4:
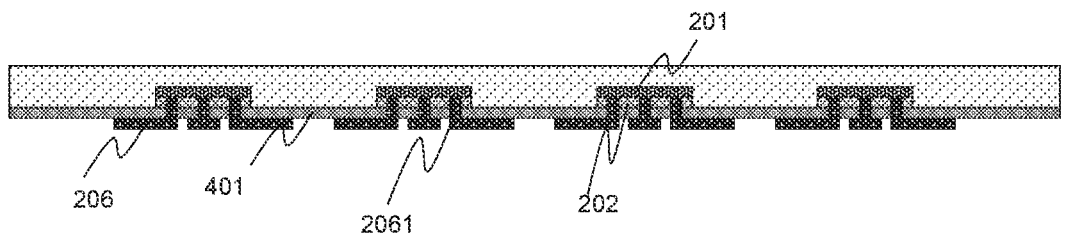
Figure 4:
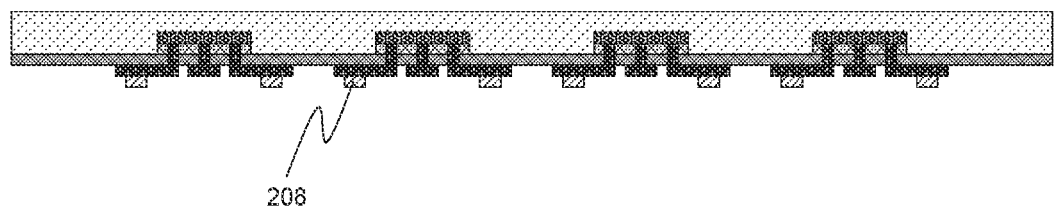
Figure 4:
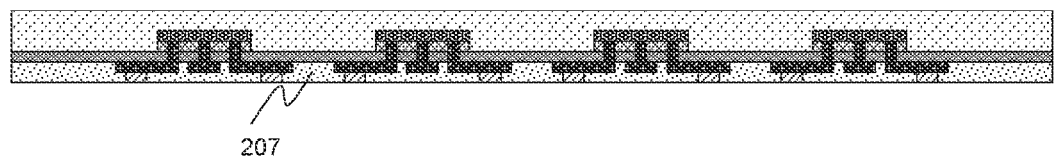
Figure 4:
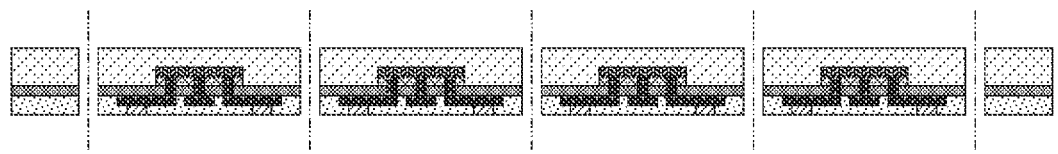
Figure 4:
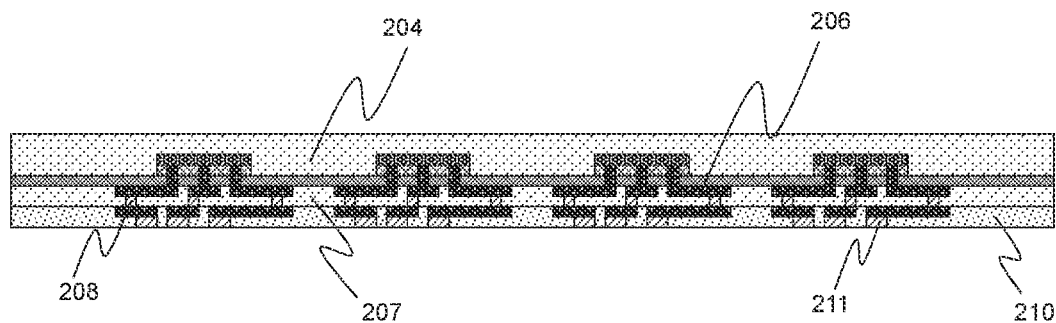

Of course, in another embodiment, when the rewiring layer is formed, if the surface is required to be the same material entirely, a passivation layer 401 may still be formed on the protective layer 202, as shown in FIG. 4 (a), Then, a protective layer opening 2021 is formed on the surface of the passivation layer, wherein the protective layer opening 2021 penetrates the passivation layer 401 and the protective layer 202 and corresponds to the bonding pad on the front surface of the chip, as shown in FIG. 4 (b). Subsequently, a first rewiring layer 206 is formed and the electrically conductive material of the first rewiring layer 206 is filled into the protective layer opening 2021 to form a connection structure 2061, as shown in FIG. 4 (c).

In an embodiment, after forming the first rewiring layer on the protective layer, the method further includes: forming a second encapsulation layer on the first rewiring layer and leading out the bonding pad or connection point of the first rewiring layer through the first electrically conductive stud. In an embodiment, as shown in FIG. 2 (k), after the first rewiring layer 206 is formed, it is packaged with a second encapsulation layer 207. After the packaging is completed, the bonding pad on the first rewiring layer 206 is led out from the surface of the second encapsulation layer 207 through the first electrically conductive stud 208 (for example, a metal post or a protruding bonding pad). The shape of the first electrically conductive stud 208 may be a circular shape, of course may be other shapes such as an elliptical shape, a square shape, a linear shape or the like.

In an embodiment, in the case where the protective layer opening 2021 and/or connection structure 2022 has been formed in the protective layer 202, when the first wiring layer 206 is formed, a more accurate alignment can be achieved in the formation of the first wiring layer 206 since the protective layer opening 2021 and/or the connection structure 2022 can be seen directly.

In an embodiment, in the implementation where the passivation layer is formed, the structures formed with the first electrically conductive stud 208 and the second encapsulation layer 207 are as shown in FIG. 4 (d) and FIG. 4 (e).

In an embodiment, the step of forming the second encapsulation layer on the first rewiring layer and leading out the bonding pad or the connection point of the first rewiring layer through the first electrically conductive stud includes: forming the first electrically conductive stud on the bonding pad or the connection point of the first rewiring layer; and forming the second encapsulation layer on the first rewiring layer and the exposed protective layer and exposing the first electrically conductive stud. For example, as shown in FIG. 2 (1), the first electrically conductive stud 208 is formed by photolithography and electroplating on the patterned wiring of the first rewiring layer 206. And then, the second encapsulation layer 207 is formed as shown in FIG. 2 (k).

In another embodiment, the step of forming the second encapsulation layer on the first rewiring layer and leading out the bonding pad or the connection point of the first rewiring layer through the first electrically conductive stud includes: forming the second encapsulation layer on the first rewiring layer; forming a first opening in the second encapsulation layer at a position corresponding to the bonding pad or the connection point of the first rewiring, layer; and forming the first electrically conductive stud in the first opening. For example, as shown in FIG. 2(m), the second encapsulation layer 207 may be formed on the first rewiring layer 206, then the first opening 2071 is formed in the second encapsulation layer 207 by hole-opening, and an electrically conductive material is filled in the first opening 2071 to form the first electrically conductive stud 208. In still another embodiment, the first opening 2071 may not be filled, so that the bonding pad or the connection point of the first rewiring layer of the completed package body is exposed from the first opening 2071.

The shape of the first electrically conductive stud 208 is preferably a circular shape, and of course may be other shapes such as a rectangular shape, a square shape or the like. The electrically conductive stud 208 is electrically connected to the first rewiring layer.

Figure 7:
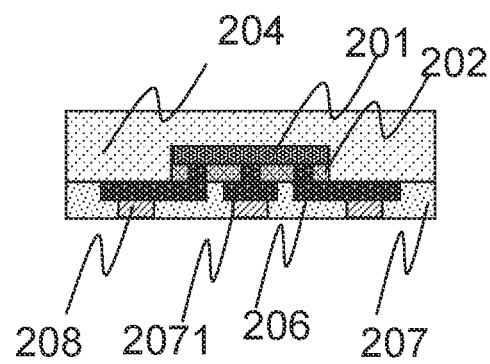
FIG. 7 is a schematic structural diagram of a chip package structure obtained by using the above method of packaging the chip according to yet another exemplary embodiment of the present disclosure.

In an embodiment, the second encapsulation layer 207 may be formed by lamination, molding or printing, and an epoxy compound is preferably used. The second encapsulation layer 207 covers the first rewiring layer 206. The first rewiring layer 206 is exposed from the surface of the second encapsulation layer 207 through the first electrically conductive stud 208. When the first electrically conductive stud 208 is first formed and then the second encapsulation layer 207 is formed, the second encapsulation layer 207 may cover all the exposed surfaces of the first encapsulation layer 204, the protective layer 202 and the first rewiring layer 206, and then thinned to the surface of the first electrically conductive stud 208, In an embodiment, in the case where a plurality of chips 201 to be packaged are packaged together, after the packaging of the first rewiring layer is completed, the whole package structure is cut into a plurality of package bodies by laser or mechanical cutting, as shown in FIG. 2 (*n*). The structure of the formed package body is as shown in FIG. 7, In the case where the surface of the protective layer is formed with the passivation layer, after the packaging of the first rewiring layer is completed, the structure of a plurality of package bodies obtained by cutting the whole package structure by laser or mechanical cutting is as shown in FIG. 4 (*f*).

In another embodiment, the step of completing the packaging by the rewiring process on the front surface of the at least one chip to be packaged includes:

forming a second rewiring layer on the second encapsulation layer, the second rewiring layer being electrically connected to the bonding pad or the connection point of the first rewiring layer through the first electrically conductive stud; and forming a third encapsulation layer on the second rewiring layer and leading out a bonding pad or a connection point of the second rewiring layer through a second electrically conductive stud.

Figure 12:
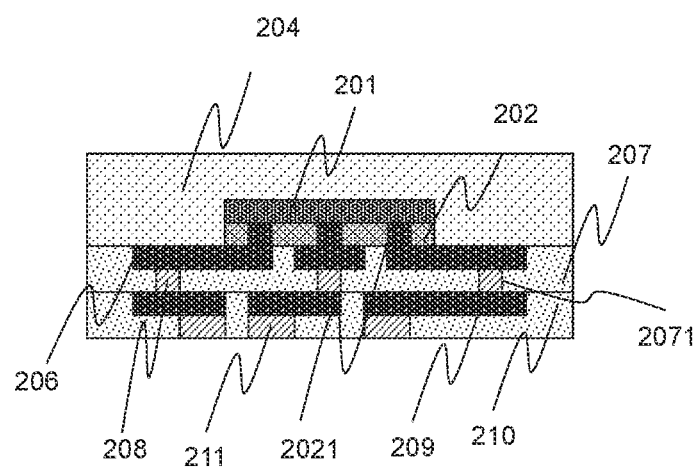
FIG. 12 is a schematic structural diagram of a chip package structure obtained by using the above method of packaging the chip according to yet another exemplary embodiment of the present disclosure.

In the present embodiment, as shown in FIG. 2 (*o*), a second rewiring layer 209 is formed on the second encapsulation layer 207. The bonding pad on the first rewiring layer 206 is electrically connected to the second rewiring layer 209 through the first electrically conductive stud 208. The bonding pad on the second rewiring layer 209 is led out through the second electrically conductive stud 211 and the second rewiring layer 209 and the exposed second encapsulation layer 207 are covered by the third encapsulation layer 210. The second electrically conductive stud 211 leads out the bonding pad or the connection point on the second rewiring layer 209 through the second opening in the third encapsulation layer 210. In this way, a multilayer package structure can be realized. The structure diagram of the formed multilayer package body is shown in FIG. 12. In the case that the passivation layer is formed on the surface of the protective layer 202, the structure after the second rewiring layer 209 is formed is as shown in FIG. 4 (*g*).

In an embodiment, the step of forming the third encapsulation layer for encapsulating the second rewiring layer and the exposed second encapsulation layer and leading out the bonding pad or the connection point of the second rewiring layer through the second electrically conductive stud includes: forming the second electrically conductive stud on the bonding pad or the connection point of the second rewiring layer, forming the third encapsulation layer on the second rewiring layer and the exposed second encapsulation layer and exposing the second electrically conductive stud. In another embodiment, the step of forming the third encapsulation layer to encapsulate the second rewiring layer and the exposed second encapsulation layer and leading out the bonding pad or the connection point of the second rewiring layer through the second electrically conductive stud, includes: forming the third encapsulation layer on the second rewiring layer and the exposed second encapsulation layer; forming a second opening in the third encapsulation layer at a position corresponding to the bonding pad or the connection point of the second rewiring layer; and forming the second electrically conductive stud in the second opening.

The forming manner of the second rewiring layer is similar to the forming manner of the first rewiring layer. The second electrically conductive stud may be formed on the second rewiring, layer after the second rewiring layer is formed and then the third encapsulation layer is formed, and the second electrically conductive stud is exposed by a corresponding process so that the second electrically conductive stud can lead out the bonding pad or the connection point on the second rewiring layer. The third encapsulation layer may also be formed on the second rewiring layer first and then the second opening is formed in the third encapsulation layer, and the second electrically conductive stud is formed in the second opening so that the second electrically conductive stud can be electrically connected to the bonding pad or the connection point on the second rewiring layer. For the specific details, reference may be made to the description of the first rewiring layer described above, and details are not described herein again.

According to an embodiment of the present disclosure, in the above method of packaging the chip, after step 102, the method further includes: forming a sealing layer which is at least wrapped around the at least one chip to be packaged.

Figure 5:
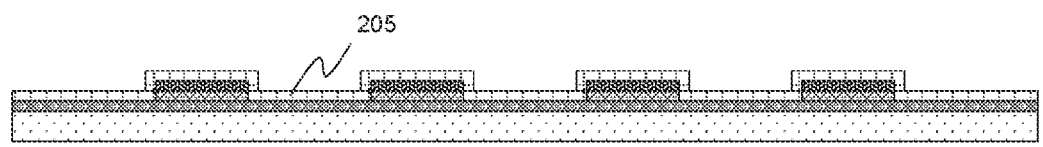
FIG. 5 (a) to (i) are schematic structural diagrams of a chip package structure obtained by using the above method of packaging the chip according to another exemplary embodiment of the present disclosure.
Figure 5:
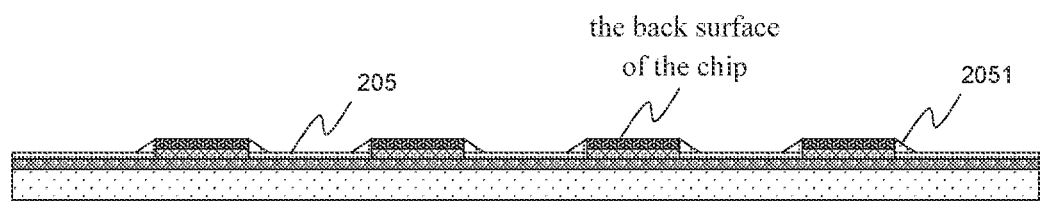
Figure 5:
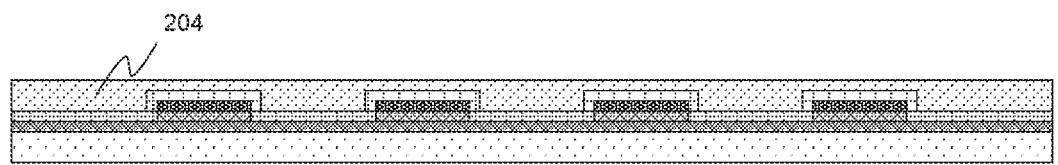
Figure 5:
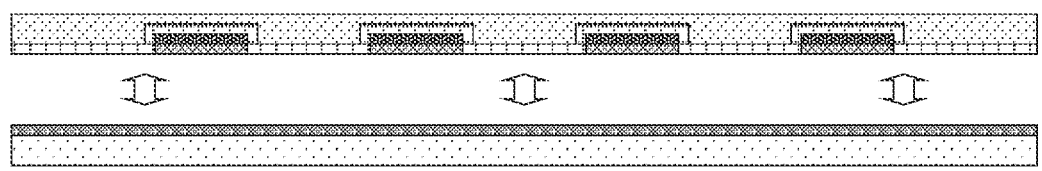
Figure 5:
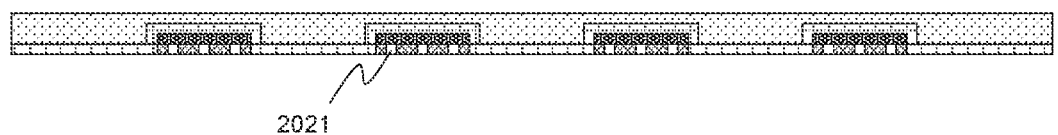
Figure 5:
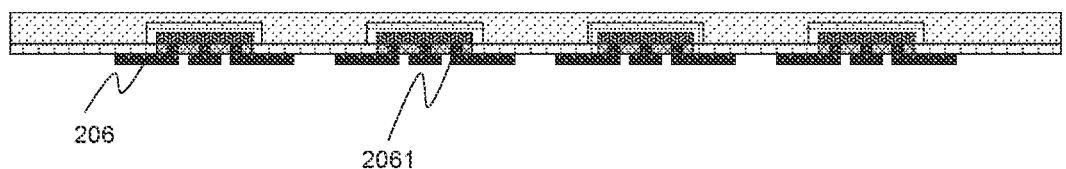
Figure 5:
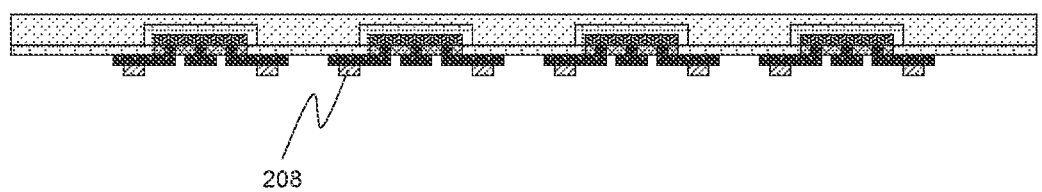
Figure 5:
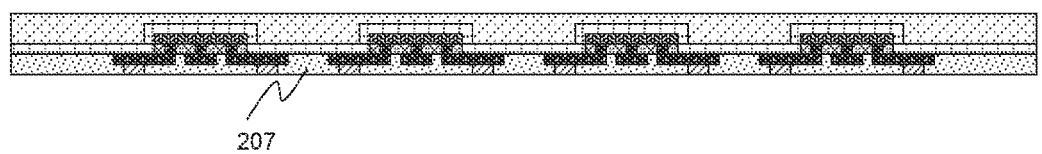
Figure 5:
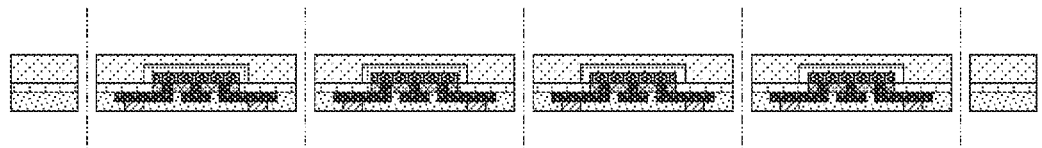
Figure 5:
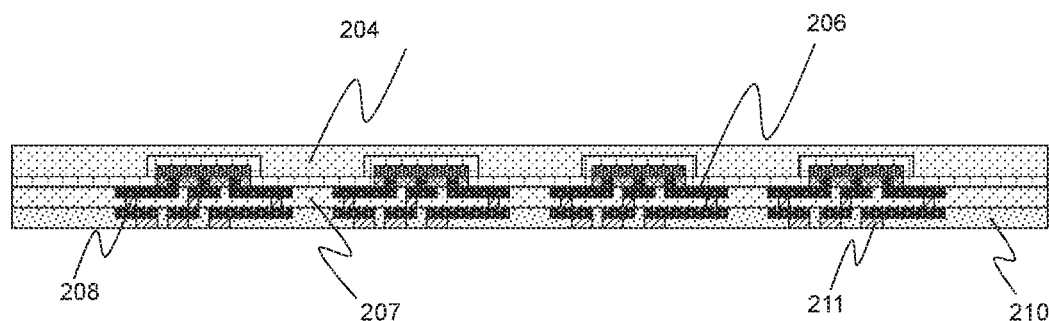

As shown in FIG. 5 (*a*), the sealing layer 205 is formed on the back surface of the chip to be packaged and the exposed adhesive layer 203 so as to wrap up the chip 201 to be packaged. In an embodiment, the sealing layer 205 may be formed by spraying, printing, coating or the like using a polymer insulating material liquid or paste. The thickness of the sealing layer 205 is smaller than the thickness of the chip 201 to be packaged. Optionally, in an embodiment, the sealing layer 205 formed on the back surface of the chip 201 to be packaged may be removed. For example, a material such as a board, a tape or the like may be used to stick away the excess sealing layer material on the back surface of the chip 201 to be packaged so as to reduce the thickness of the first encapsulation layer formed subsequently, thereby reducing the thickness of the final package body.

In actual operation, the polymer insulating material is preferably liquid or pasty so that after the spraying is completed, it will flow to surround the chip 201 to be packaged and cover all gaps to achieve a uniform thickness. After the material is cured by a curing method, the sealing layer 205 may wrap up the chip 201 to be packaged to lock the position of the chip 201 to be packaged unchanged, as shown in FIG. 5 (*a*). The shape of the sealing layer 205 mainly depends on the properties such as viscosity, tension and the like of the material of the sealing layer. Of course, in other embodiments, the sealing layer 205 may also be formed by dispensing or the like. The sealing layer material is dispensed on the adhesive layer 203 between the chips to be packaged by air or pressure generated mechanically, so that the sealing layer material does not cover the back surface of the chip 201 to be packaged, as shown in FIG. 5 (*b*). The sealing layer shall be curable material, and cured by high temperature, ultraviolet rays or the like. According to the above embodiment of the present disclosure, the sealing layer 205 is wrapped around the chip 201 to be packaged, so that the situation that after the chip 201 to be packaged shifted in a subsequent process, the rewiring layer cannot be electrically connected to the bonding pad on the front surface of the chip 201 to be packaged due to the inability to predict the positions of the chip 201 to be packaged after the shift, can be avoided.

The sealing layer 205 covers the entire surface of the carrier 200 when the sealing layer 205 is formed. The sealing layer 205 is continuously and uninterruptedly formed on the upper surface of the first encapsulation layer and at least wrapped around the chip to be packaged. After the carrier 200 is detached, the exposed surfaces are the surfaces of the protective layer 202 and the sealing layer 205, In an implementation manner, a sealing layer matching the protective layer 202 may be selected. That is, the properties such as the expansion coefficient and the elastic modulus of the protective layer material and the sealing layer material are similar, so that after the first wiring layer 206 is formed on the two types of materials, the wiring is not affected due to different material properties. Optionally, the same material may be used for the protective layer material and the sealing layer material. In addition, in the above embodiment, the dependence on the passivation layer can be further reduced by forming the sealing layer 205 and the protective layer 202.

In this embodiment, after the sealing layer 205 is formed, the first encapsulation layer 204 is formed corresponding to the above step 103. In this manner, the first encapsulation layer 204 is formed on the surface of the sealing layer 205, or on the sealing layer 205 and the back surface of the chip 201 to be packaged (if the sealing layer on the back surface of the chip is removed first), as shown in FIG. 5 (c). For the details such as the forming-manner, the material and the like of the first encapsulation layer 204, reference may be made to the description of step 103, and details are not described herein again.

Figure 9:
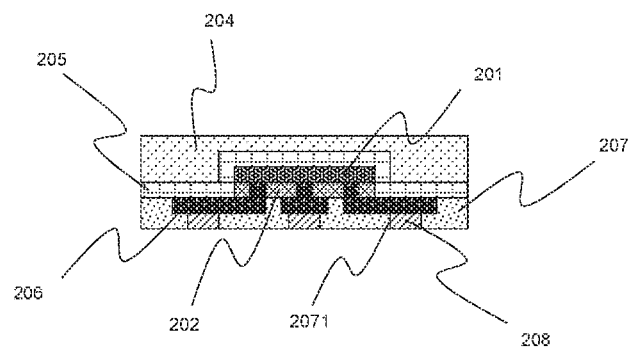
FIG. 9 is a schematic structural diagram of a chip package structure obtained by using the above method of packaging the chip according to yet another exemplary embodiment of the present disclosure.

In this embodiment, after the first encapsulation layer 204 is formed, corresponding to the above step 104, the carrier 200 is detached to expose the protective layer, as shown in FIG. 5 (d). And then, the protective layer opening 2021 is formed on the protective layer 202, as shown in FIG. 5 (e). Subsequently, the first wiring layer 206 is formed wherein the first wiring layer 206 is formed on the surface of the protective layer 203, and the wiring layer material is simultaneously filled into the protective layer opening 2021 to form the connection structure 2061, as shown in FIG. 5 (f). Thereafter, the first electrically conductive stud 208 and the second encapsulation layer 207 are formed on the first wiring layer 206, wherein the first electrically conductive stud 208 is used to lead the first wiring layer 206 to the surface of the second encapsulation layer 207, as shown in FIG. 5 (g) and 5 (h). In a structure that requires only single-layer wiring, a plurality of package bodies can be obtained by cutting, as shown in FIG. 5 (i). After the cutting, the structure of each package body is as shown in FIG. 9.

If further rewiring is required, a second rewiring layer 209 may be formed on the second encapsulation layer 207, and the second rewiring layer 209 is electrically connected to the first rewiring layer 206 through the first electrically conductive stud 208, as shown in FIG. 5 (j). For the details of the above step, reference may be made to the detailed description of the rewiring process after step 104 described above, and details are not described herein again.

In an embodiment, after the adhesive layer 203 is formed on the first carrier 200, a passive component may be further mounted on the adhesive layer 203. The passive component is mounted at a predetermined position of the first carrier 200, so that the passive component is located in the vicinity of the component to be packaged. The back surface of the passive component faces towards the first encapsulation layer. After the first rewiring layer 206 is formed, the front surface of the passive component is electrically connected to the first rewiring layer.

Figure 6:
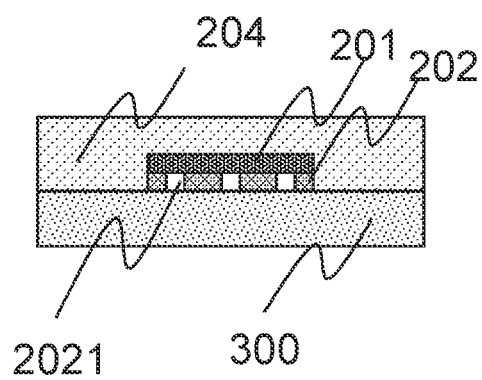
FIG. 6 is a schematic structural diagram of a chip package structure obtained by using the above method of packaging the chip according to another exemplary embodiment of the present disclosure.

FIG. 6 is a schematic structural diagram of a chip package structure Obtained by using the above method of packaging the chip provided by an exemplary embodiment of the present disclosure. As shown in FIG. 6, the chip package structure includes:

a first encapsulation layer 204 disposed with at least one concave first cavity;

a chip 201 located in the first cavity, the back surface of the at least one chip 201 to be packaged facing towards the first encapsulation layer 204;

a protective layer 202 formed on the front surface of the chip 201; wherein a protective layer opening 2021 is formed in the protective layer 202 and the protective layer opening 2021 is located at a position corresponding to a bonding pad on the front surface of the chip 201; and a rewiring structure 300 formed on the front surface of the chip 201 for leading out a bonding pad on the front surface of the chip 201.

FIG. 7 is a schematic structural diagram of a chip package structure in another exemplary embodiment of the present disclosure. As shown in FIG. 7, the chip package structure includes:

a first encapsulation layer 204 disposed with at least one concave first cavity;

a chip 201 located in the first cavity, the back surface of the at least one chip 201 to be packaged facing towards the first encapsulation layer 204;

a protective layer 202 formed on the front surface of the chip 201, wherein a protective layer opening 2021 is formed in the protective layer 202 and the protective layer opening 2021 is located at a position corresponding to a bonding pad on the front surface of the chip 201; and a rewiring structure 300 including:

a first rewiring layer 206 formed on the protective layer 202 and the first encapsulation layer 204 and electrically connected to the bonding pad of the chip 201 through the protective layer opening 2021; and a second encapsulation layer 207 formed on the first rewiring layer 206 and the exposed first encapsulation layer 204 and having a first opening 2071, wherein a first electrically conductive stud 208 electrically connected to the first rewiring layer 206 is disposed in the first opening 2071.

In the present embodiment, the chip package structure described above can be obtained by the above method of packing the chip and the process flow shown in FIGS. 2 (a) to (o). For the specific details, reference may be made to above detailed description of the method of packaging the chip and the process flow, and details are not described herein again.

Figure 8:
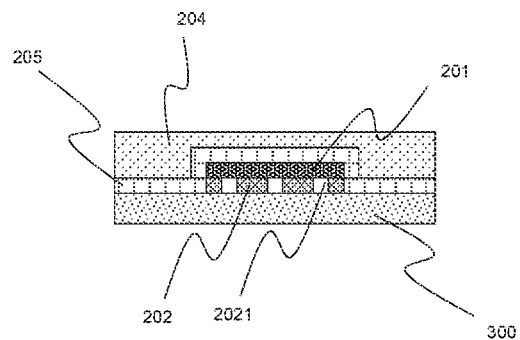
FIG. 8 is a schematic structural diagram of a chip package structure obtained by using the above method of packaging the chip according to yet another exemplary embodiment of the present disclosure.

FIG. 8 is a schematic structural diagram of a chip package structure Obtained by using the above method of packaging the chip provided by another exemplary embodiment of the present disclosure. As shown in FIG. 8, the chip package structure includes:

a first encapsulation layer 204 disposed with at least one concave first cavity;

a chip 201 located in the first cavity, the back surface of the at least one chip 201 to be packaged facing towards the first encapsulation layer 204;

a sealing layer 205 formed on the upper surface of the first encapsulation layer 204 and at least wrapped around the chip 201.

a protective layer 202 formed on the front surface of the chip 201, wherein a protective layer opening 2021 is formed in the protective layer 202 and the protective layer opening 2021 is located at a position corresponding to a bonding pad on the front surface of the chip 201;

a rewiring structure 300 formed on the front surface of the chip 201 for leading out the bonding pad on the front surface of the chip 201.

FIG. 9 is a schematic structural diagram of a chip package structure in another exemplary embodiment of the present disclosure. As shown in FIG. 9, the chip package structure includes:
- a first encapsulation layer 204 disposed with at least one concave first cavity;
- a chip 201 located in the first cavity, the back surface of the at least one chip 201 to be packaged facing towards the first encapsulation layer 204;
- a sealing layer 205 formed on the upper surface of the first encapsulation layer 204 and at least wrapped around the chip 201.
- a protective layer 202 formed on the front surface of the chip 201, wherein a protective layer opening 2021 is formed in the protective layer 202 and the protective layer opening 2021 is located at a position corresponding to a bonding pad on the front surface of the chip 201; and
- a rewiring structure 300 including:
- a first rewiring layer 206 formed on the protective layer 202 and the sealing layer 205 and electrically connected to the bonding pad of the chip 201 through the protective layer opening 2021; and
- a second encapsulation layer 207 formed on the first rewiring layer 206 and the exposed sealing layer 205 and having a first opening 2071, wherein a first electrically conductive stud 208 electrically connected to the first rewiring layer 206 is disposed in the first opening 2071.

In the present embodiment, the chip package structure described above can be obtained by the above method of packing the chip and the process flow shown in FIGS. 2 (*a*) to (*o*). For the specific details, reference may be made to above detailed description of the method of packaging the chip and the process flow, and details are not described herein again.

Figure 10:
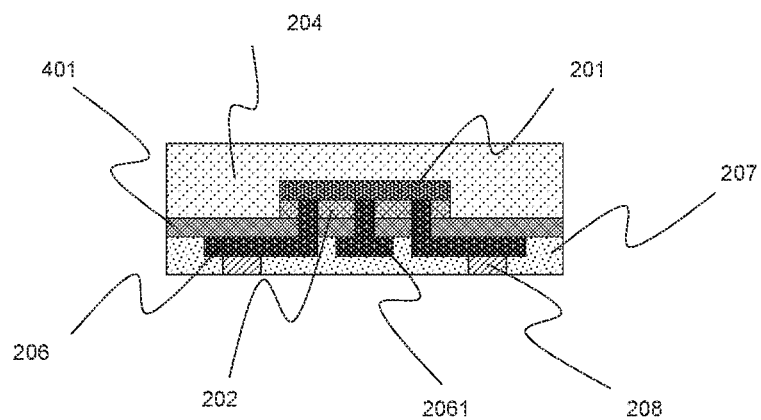
FIG. 10 is a schematic structural diagram of a chip package structure obtained by using the above method of packaging the chip according to yet another exemplary embodiment of the present disclosure.

FIG. 10 is a schematic structural diagram of a chip package structure obtained by using the above method of packaging the chip provided by an exemplary embodiment of the present disclosure. As shown in FIG. 10, the chip package structure includes:
- a first encapsulation layer 204 disposed with at least one concave first cavity;
- a chip 201 located in the first cavity, the back surface of the at least one chip 201 to be packaged facing towards the first encapsulation layer 204;
- a protective layer 202 formed on the front surface of the chip 201, wherein a protective layer opening 2021 is formed in the protective layer 202 and the protective layer opening 2021 is located at a position corresponding to a bonding pad on the front surface of the chip 201; and
- a rewiring structure 300 including:
- a passivation layer 401 formed on the protective layer 202 and the first encapsulation layer 204;
- a first rewiring layer 206 formed on the passivation layer 401 and electrically connected to the bonding pad of the chip 201 through the protective layer opening 2021;
- a second encapsulation layer 207 formed on the first rewiring layer 206 and the exposed first encapsulation layer 204 and having a first opening 2071, wherein a first electrically conductive stud 208 electrically connected to the first rewiring layer 206 is disposed in the first opening 2071.

In the present embodiment, the chip package structure described above can be obtained by the above method of packing the chip and the process flow shown in FIGS. 4 (*a*) to (*g*). For the specific details, reference may be made to above detailed description of the method of packaging the chip and the process flow, and details are not described herein again.

Figure 11:
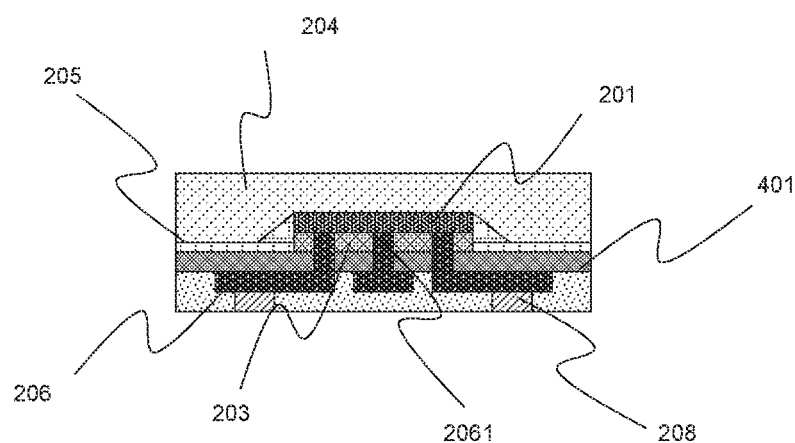
FIG. 11 is a schematic structural diagram of a chip package structure obtained by using the above method of packaging the chip according to yet another exemplary embodiment of the present disclosure.

FIG. 11 is a schematic structural diagram of a chip package structure in an exemplary embodiment of the present disclosure. As shown in FIG. 11 the chip package structure includes:
- a first encapsulation layer 204 disposed with at least one concave first cavity;
- a chip 201 located in the first cavity, the back surface of the at least one chip 201 to be packaged facing towards the first encapsulation layer 204;
- a sealing layer 205 formed on the upper surface of the first encapsulation layer 204 and at least wrapped around the chip 201.
- a protective layer 202 formed on the front surface of the chip 201, wherein a protective layer opening 2021 is formed in the protective layer 202 and the protective layer opening 2021 is located at a position corresponding to a bonding pad on the front surface of the chip 201; and
- a rewiring structure 300 including:
- a passivation layer 401 formed on the protective layer 202 and the sealing layer 205;
- a first rewiring layer 206 formed on the passivation layer 401 and electrically connected to the bonding pad of the chip 201 through the protective layer opening 2021;
- a second encapsulation layer 207 formed on the first rewiring layer 206 and the exposed sealing layer 205 and having a first opening 2071, wherein a first electrically conductive stud 208 electrically connected to the first rewiring layer 206 is disposed in the first opening 2071.

In the present embodiment, the chip package structure described above can be obtained by the above method of packing the chip and the process flow shown in FIGS. 5 (*a*) to (*j*). For the specific details, reference may be made to above detailed description of the method of packaging the chip and the process flow, and details are not described herein again.

FIG. 12 is a schematic structural diagram of a rewiring structure 300 of a chip package structure in another exemplary embodiment of the present disclosure. As shown in FIG. 12, the chip package structure includes:
- a first encapsulation layer 204 disposed with at least one concave first cavity;
- a chip 201 located in the first cavity, the back surface of the at least one chip 201 to be packaged facing towards the first encapsulation layer 204;
- a protective layer 202 formed on the front surface of the chip 201, wherein a protective layer opening 2021 is formed in the protective layer 202 and the protective layer opening 2021 is located at a position corresponding to a bonding pad on the front surface of the chip 201; and
- a rewiring structure 300 including:
- a first rewiring layer 206 formed on the protective layer 202 and the first encapsulation layer 204 and electrically connected to the bonding pad of the chip 201 through the protective layer opening 2021;
- a second encapsulation layer 207 formed on the first rewiring layer 206 and the exposed first encapsulation layer 204 and having a first opening 2071, wherein a first electrically conductive stud 208 electrically connected to the first rewiring layer 206 is disposed in the first opening 2071;

a second rewiring layer 209 formed on the second encapsulation layer 207 and electrically connected to the bonding pad of the first rewiring layer 206 through the first electrically conductive stud 208; and a third encapsulation layer 210 for encapsulating the second rewiring layer 209 and the exposed second encapsulation layer 207 and leading out the bonding pad of the second rewiring layer 209 through the second electrically conductive stud 211.

For the details of the present embodiment, reference may be made to the description of the above method of packaging the chip and the process flow shown in FIGS. 2 (*a*) to (*o*), details are not described herein again.

Similar to the embodiment shown in FIG. 12, the rewiring structures 300 in the chip package structures shown in FIGS. 7, 9 and 11 may further include:

a second rewiring layer formed on the second encapsulation layer 207 and electrically connected to the bonding pad of the first rewiring layer 206 through the first electrically conductive stud 208; and a third encapsulation layer for encapsulating the second rewiring layer 209 and the exposed second encapsulation layer 207 and leading out the bonding pad of the second rewiring layer 209 through the second electrically conductive stud.

For details, reference may be made to the description of the structures shown in FIGS. 2 (*a*) to (*o*), FI is 4 (a) to (h) and FIGS. 5 (*a*) to (*j*), and details are not described herein again.

The chip package structures shown in FIGS. 7, 9, 11 and 12 may further include:

at least one passive component in at least concave second cavity disposed on the first encapsulation layer 204, wherein the second cavity is disposed in the vicinity of the first cavity, the back surface of the at least one passive component faces towards the first encapsulation layer 204, and the front surface of the at least one passive component is electrically connected to the first rewiring layer 206.

The above specific embodiments are used to describe the objectives, technical solutions and beneficial effects of the present disclosure in further detail. It should be understood that the foregoing is only the specific embodiments of the present disclosure and is not intended to limit the present disclosure. Any modifications, equivalent replacements, improvements, and the like made within the spirit and principle of the present disclosure should be included in the scope of the present disclosure.

What is claimed is:

1. A method of packaging a chip, comprising:
    providing a wafer prepared with a plurality of dies, the wafer includes front and back wafer surfaces, wherein the front wafer surface of the wafer is an active wafer surface with bond pads of the plurality of dies;
    forming a protective layer on the front wafer surface, the protective layer being unitary and having first and second protective layer surfaces, wherein the second protective layer surface is disposed on the front wafer surface;
    forming via openings in the protective layer to expose the bond pads, wherein the via openings comprises sidewalls not parallel to the front wafer surface;
    dicing the wafer with the protective layer to separate the pluralities of dies into individual chips with front and back chip surfaces, wherein the front chip surface of the chips comprises the bond pads;
    mounting the plurality of chips with the protective layer on a chip carrier with an adhesive layer, wherein the first protective layer surface is disposed on the adhesive layer;
    encapsulating the plurality of chips with a high pressured encapsulant to form a mold panel, the mold panel includes first and second encapsulant surfaces of the high pressured encapsulant, wherein the first encapsulant surface is coplanar with the first protective layer surface;
    detaching the chip carrier with the adhesive layer from the mold panel with the plurality of chips;
    forming a rewiring structure on the first protective layer surface of the protective layer, wherein the rewiring structure includes conductive lines electrically coupled to the bond pads of the plurality of chips, and forming the rewiring structure comprises
        forming first patterned rewiring lines of a first rewiring layer directly on the first protective layer surface, wherein the first patterned rewiring lines are connected to the bond pads by via contacts in the via openings, and
        forming a first rewiring encapsulation layer, wherein the first rewiring encapsulation layer covers the first patterned rewiring lines; and
    singulating the plurality of chips of the mold panel with the high pressured encapsulant and the rewiring structure to form a plurality of chip packages.

2. The method of claim 1 comprises forming first conductive studs connected to the first patterned rewiring lines, wherein a surface of the first rewiring encapsulation layer is coplanar with a surface of the first conductive studs.

3. The method of claim 2 comprises forming package contacts on the first conductive studs.

4. The method of claim 2 further comprises:
    forming second patterned rewiring lines of a second rewiring layer on the first rewiring encapsulation layer, wherein the second patterned rewiring lines are coupled to the first conductive studs; and
    forming a second rewiring encapsulation layer, the second rewiring encapsulation layer covers the second patterned rewiring lines and the first rewiring encapsulation layer.

5. The method of claim 4 comprises forming second conductive studs connected to the second patterned rewiring lines, wherein a surface of the second rewiring encapsulation layer is coplanar with a surface of the second conductive studs.

6. The method of claim 1 wherein:
    the chip carrier comprises a plurality of package regions;
    mounting the plurality of chips on the chip carrier comprises mounting a chip and a passive component on each package region of the chip carrier; and
    wherein the rewiring structure in each package region connects the chip and passive component in the package region.

7. The method of claim 1 wherein forming the protective layer comprises forming an ABF layer configured to prevent permeation of the high pressured encapsulant between the dies and the protective layers of the dies during processing.

8. The method of claim 1 wherein the second encapsulant surface of the mold panel covers the back chip surface of the plurality of chips.

9. The method of claim 1 wherein forming the via openings in the protective layer comprises laser etching.

* * * * *